(12) United States Patent
Boeh et al.

(10) Patent No.: US 6,798,695 B2
(45) Date of Patent: Sep. 28, 2004

(54) ARRANGEMENT FOR STORING A COUNT

(75) Inventors: Frank Boeh, Rosengarten (DE); Juergen Nowottnick, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 116 days.

(21) Appl. No.: 10/236,180

(22) Filed: Sep. 6, 2002

(65) Prior Publication Data

US 2003/0067803 A1 Apr. 10, 2003

(30) Foreign Application Priority Data

Sep. 10, 2001 (DE) .......................................... 101 44 503

(51) Int. Cl.⁷ .............................................. G11C 16/04
(52) U.S. Cl. ................................. 365/185.11; 365/236
(58) Field of Search ........................... 365/185.11, 236, 365/185.24

(56) References Cited

U.S. PATENT DOCUMENTS 4,150,333 A * 4/1979 Edwards et al. ............ 368/118
4,774,544 A * 9/1988 Tsuchiya et al. .............. 399/24

* cited by examiner

Primary Examiner—Thong Q. Le
(74) Attorney, Agent, or Firm—Aaron Waxler

(57) ABSTRACT

In an arrangement for storing a count, which comprises a non-volatile memory (1) which has at least 3 memory segments (2, 3, 4), a controller (5) is provided which stores a new count in one of the memory segments (2, 3, 4), the controller (5) for selecting this memory segment (2, 3 or) searching for the memory segment whose stored value has a larger difference from the stored values of the other memory segments than the stored values of the other memory segments and which controller, should such a segment exist, selects this segment for storing the new count. If, conversely, no such segment exists, the controller selects a memory segment (2, 3, 4) in accordance with a selection instruction oriented to the memory contents.

7 Claims, 1 Drawing Sheet

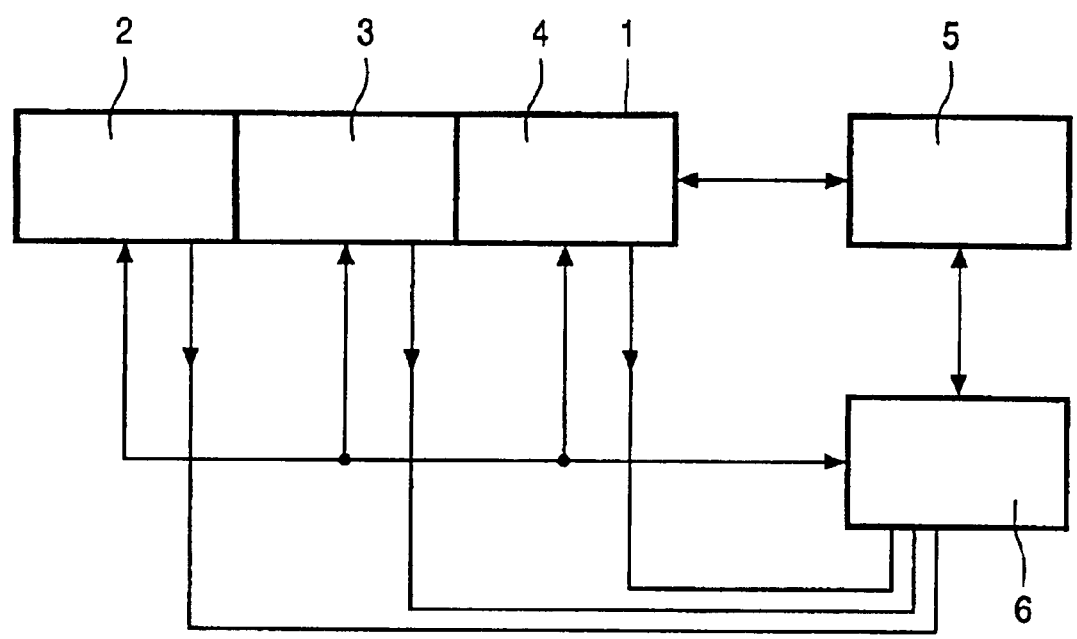

ARRANGEMENT FOR STORING A COUNT

The invention relates to an arrangement for storing a count with a non-volatile memory.

Arrangements are provided, for example, for access systems, which arrangements re-store a count of a counter after each counting operation. Since such systems can be used under critical by-pass conditions, great importance is to be placed on an error-free storage of the count in a non-volatile memory (for example in an EEPROM). Such interruptions may occur in the power supply itself, for example, by a failure of the battery voltage, but it may also be an insufficient contact or a switch-over of the operating voltage.

Known memory arrangements provided for such purposes work with a redundant storage of each new count. This means that the new count is stored in two or even three memory segments of an EEPROM and there is established by validity flags, by checksum tests or by comparison of the memory contents which count is valid.

These known arrangements have the disadvantage that the EEPROM with each storage of a new count is to be written anew into two memory segments and thus the useful life of the EEPROM which permits only a limited number of storing cycles is unnecessarily shortened.

It is an object of the invention to provide an arrangement of the type defined in the opening paragraph which writes only one memory segment for each storage of a new count even under the secured conditions mentioned in the introductory part.

If a new count is written in a non-volatile memory after a counting operation in the arrangement, disturbances in the voltage supply may occur during this operation so that, where appropriate, the stored value is false or can no longer be read. As the case may be, the externally provided counter may also have a memory but the contents of the memory may be erased as a result of failures of the power supply. As a result, the latest count can no longer be reconstructed in such a case.

The arrangement according to the invention is therefore to satisfy two conditions. On the one hand, it should be possible to establish which count is invalid, thus, for example, developed from writing during a power failure and having an arbitrary value but not corresponding to the count to be stored. After identification of such a "falsely" stored count, the latest valid count stored before this invalid count is to be found.

The arrangement according to the invention stores each new count only in one of the three memory segments of a non-volatile memory. As against the state-of-the-art arrangement a doubling or tripling, respectively, of the useful life of the EEPROM is thus achieved.

In order to achieve this object a controller provided in the arrangement selects before it stores a new count in one of the memory segments the segment that either has an erroneous count or is selected in accordance with a selection instruction which is oriented to memory contents.

For the selection of this memory segment the controller searches for a memory segment whose stored value has the largest difference compared to the stored values of the other memory segments. Thus for each of the memory segments its stored value is compared to the stored values of the other memory segments and, accordingly, differences are formed. If a stored value of one of the memory segments has a larger difference from the stored values of the other memory segments than the stored values of the other memory segments, it is selected for the write operation.

The largest difference is an indication that it is an erroneously stored count because when the counts are stored correctly the sums of the differences of the stored values of a memory segment are to equal the stored values of the other memory segments. This means that for each memory segment this sum is to be equal to the difference. However, if a count has been stored erroneously in one of the memory segments, this difference is most probably larger. Therefore, the stored value of this memory segment is an erroneously stored count. This memory segment thus found is selected for storing the new count because it has invalid contents.

If no memory segment is found whose stored value has a larger difference from the stored values of the other memory segments than the stored values of the other memory segments, a memory segment is selected oriented to the memory contents.

This is the normal case where the stored values of all three memory segments are valid and thus have the same differences from the other stored values. In this case the new memory segment to be written is selected according to a selection instruction in dependence on the memory contents. This selection instruction may depend, for example, on the type of the counting operation; in dependence on the counting rate the memory segment is selected on the basis of which the counting operation is to be continued.

The arrangement according to the invention thus avoids any redundant storage and nevertheless achieves the advantage that even in the case of failures of the power supply and invalid memory contents of a memory segment the counting rate is not disturbed, because the memory segment that detects invalid contents is written anew and thus, thereafter, valid counts are stored in all three memory segments from which counts further counting operations may be proceeded with.

The circuitry and cost involved in the implementation is relatively low and besides, the method generally leads to an increase of the security against data loss. Since the memory segments are exclusively used for storing counts, these operations may be optimized and thus an increase of the permitted number of write cycles can be achieved.

An embodiment of the invention as claimed in claim 2 provides for the case where the external counter is an up-counter that the selection instruction consists of selecting the memory segment that has the lowest stored value. In the case where no memory segment is found whose stored value has higher differences from the stored values of the other memory segments than the stored values of the other memory segments, the selection instruction takes effect which, in an up-counter may advantageously consist of selecting for the new storage operation the memory segment that has the lowest stored value because this memory segment contains the oldest count.

Conversely, as provided in accordance with a further embodiment of the invention as claimed in claim 3, the memory segment having the highest stored value can be written anew if a down-counter is provided.

As claimed in claim 4 a threshold may be advantageously provided for determining the differences described above, at the exceeding of which threshold it is assumed that the respective memory segment contains an invalid stored value. With the known counting rate it is also known what maximum differences the stored values of the memory segments may have compared to each other. If for a stored value of a memory segment there are higher differences which transgress the threshold, it may be assumed that this stored value is invalid. Therefore, already when the threshold is transgressed, the above requirement may be considered satisfied so that in the case where this threshold is transgressed during the difference formation, the respective memory segment is immediately selected for storing the new count.

According to further embodiments of the invention as claimed in claims 5 and 6 there is provided that a new count to be calculated starting from the maximum stored value of the memory segments in case of an up-counter and from the minimum stored value of the memory segments in case of a down-counter.

The externally provided counter may thus advantageously select this value from the memory segments and use it for the next counting operation.

An example of embodiment of the arrangement according to the invention for storing counts will be further explained with reference to the sole FIGURE of the drawing.

BRIEF DESCRIPTION OF DRAWING

The FIGURE shows in the form of a schematic block circuit diagram a non-volatile memory 1 comprising three memory segments 2, 3 and 4.

Furthermore, a counter 5 is provided which no longer belongs to the storage arrangement according to the invention and which produces a new count with each counting operation, which new count is to be stored in the non-volatile memory 1. The counter may, in essence, be an up-counter or down-counter; in the example of embodiment it is assumed that it is an up-counter having step size 1.

Furthermore, a controller 6 is provided which controls the writing of the memory segments 2, 3 and 4 of the non-volatile memory 1 and which is also capable of reading the memory contents from the memory segments 2, 3 and 4. The controller 6 can also control the externally provided counter 5 as required, which is assumed to happen in the example of embodiment.

After each counting operation of the external counter 5 the new count in the arrangement according to the invention is stored only in one of the memory segments 2, 3 or 4 of the non-volatile memory 1. Thus with each new writing operation only one of the memory cells is loaded.

However, a selection is to be made which of the memory cells 2, 3 and 4 is to be chosen for a writing operation.

This is particularly relevant for the case where a detection has occurred while an earlier count was being written in one of the memory segments 2, 3 or 4, which detection may be, for example, a power failure. This would then lead to the fact that the respectively stored count in the relevant memory segment 2, 3 or 4 is invalid because in such case particularly any values may be written. Therefore, with each new writing operation of the arrangement according to the invention a check is made whether one of the memory segments 2, 3 or 4 has invalid memory contents i.e. a stored value. For this purpose the stored value of each of the memory segments is compared to the stored values of the other memory segments and the respective differences are formed. If these differences have a clearly higher value for one of the segments than for the other memory segments, the value in the respective memory segment is most probably invalid.

For example, if counter 5 is an up-counter having step size 1, the stored value of one of the memory segments always has a difference of 1 from the stored values of the other memory segments. The stored values of the other two memory segments have a difference of 1 from a stored value of one memory segment and a difference of 2 from that of the other memory segment. Among the memory segments there is thus no segment whose stored value has a larger difference from the stored values of the other memory segments than the stored values of the other memory segments. There is always at least 1 other memory segment whose stored value has the same difference from the stored values of the other memory segments.

In this constellation the stored values of all three memory segments 2, 3 and 4 are most probably valid. Then, in accordance with a selection instruction, in dependence on the stored values of the memory segments, the memory segment is chosen that is appropriately to be chosen in dependence on the counting operation. As a rule, it will be the memory segment that has stored the oldest count. In the example of embodiment in which an external up-counter 5 is provided, the memory segment is selected whose stored value is the lowest.

If, however, a previous writing operation of a previous count was erroneous, it will be established during the above-described difference formation that the memory value of this respective memory segment shows a larger difference from the stored values of the other memory segments than the stored values of all the other memory segments. The stored value of this memory segment is thus identified as invalid and is overwritten by the new count. In this way this invalid count is removed from one of the memory segments 2, 3 or 4 and overwritten by a new valid count.

At any rate the respective highest stored count that has been stored as a stored value in one of the memory segments 2, 3 and 4 can be used as a starting point for each new counting operation.

The arrangement according to the invention for storing counts thus forms a relatively small load on the memory segments 2, 3 and 4 of the non-volatile memory 1 compared to prior-art arrangements, because each new count is stored in only one of the memory segments 2, 3 or 4 and thus the non-volatile memory 1 experiences only little load during storage operations.

In addition, when the differences are checked, generally a check is made of the stored values, so that the general operation reliability is increased. Also further occurring data errors are detected.

The arrangement according to the invention is particularly advantageous for battery-operated access systems in which power failures may occur with relatively high probability.

What is claimed is:

1. An arrangement for storing a count comprising a non-volatile memory (1) which has at least three memory segmentS (2, 3, 4), a controller (5) being provided which stores a new count in one of the memory segments (2, 3, 4), the controller (5) for selecting this memory segment searching for the memory segment whose stored value has a larger difference from the stored values of the other memory segments than the stored values of the other memory segments and which controller, should such a memory segment exist, selects this for storing the new count, and the controller (5) selecting a memory segment (2, 3, 4) in accordance with a selection instruction oriented to the memory contents in case no memory segment (2, 3, 4) is found whose stored value has a larger difference from the stored values of the other memory segments than the other memory segments.

2. An arrangement as claimed in claim 1, characterized in that the respective new count originates from an up-counter and in that the selection instruction consists in selecting the memory segment (2, 3, 4) that has the lowest stored value.

3. An arrangement as claimed in claim 1, characterized in that the respective new count originates from a down-counter and in that the selection instruction prescribes to select the memory segment (2, 3, 4) having the highest stored value.

4. An arrangement as claimed in claim 1, characterized in that a threshold is provided and in that during the search for the memory segment (2, 3, 4) whose stored value has the largest difference from the stored values of the other memory segments, if the differences of the stored value of one memory segment from the stored values of the other memory segments exceed the threshold, the respective memory segment is selected for storing the new count.

5. An arrangement, as claimed in claim 2, characterized in that the new count is computed from the maximum stored value of the memory segments (2, 3, 4).

6. An arrangement as claimed in claim 3, characterized in that the new count is computed from the minimum stored value of the memory segments (2, 3, 4).

7. An application of the arrangement as claimd in claim 1 for a battery-operated access system.

* * * * *